United States Patent
Wen et al.

[19]

[11] Patent Number: 6,113,165
[45] Date of Patent: Sep. 5, 2000

[54] SELF-SENSING WAFER HOLDER AND METHOD OF USING

[75] Inventors: Ming Chien Wen, Hsin-Chu; Ching Hsu Ho, Taipei; Yu Tsung Fu, Miao Li; Kwen Sz Lin, Kao Hsiung, all of Taiwan

[73] Assignee: Taiwan Semiconductor Manufacturing Co., Ltd., Hsin-Chu, Taiwan

[21] Appl. No.: 09/166,058

[22] Filed: Oct. 2, 1998

[51] Int. Cl.[7] .................................................. B65G 65/00
[52] U.S. Cl. ............................ 294/1.1; 294/907; 901/46; 414/941; 361/234
[58] Field of Search ............................... 294/1.1, 32, 907; 901/46, 47, 33, 49; 414/941, 935, 937; 361/234

[56] References Cited

U.S. PATENT DOCUMENTS

| | | | |
|---|---|---|---|
| 4,040,736 | 8/1977 | Johannsmeier | 355/43 |
| 4,093,378 | 6/1978 | Horr et al. | 355/76 |
| 5,044,752 | 9/1991 | Thurfjell et al. | 414/416 |
| 5,103,367 | 4/1992 | Horwirz et al. | 361/234 |
| 5,173,832 | 12/1992 | Giorgetta et al. | 361/88 |
| 5,400,209 | 3/1995 | Moslehi | 361/234 |
| 5,436,790 | 7/1995 | Blake et al. | 361/234 |
| 5,444,342 | 8/1995 | Matsuo et al. | 901/49 |
| 5,444,597 | 8/1995 | Blake et al. | 361/234 |
| 5,445,486 | 8/1995 | Kitayama et al. | 294/1.1 |
| 5,556,147 | 9/1996 | Somekh et al. | 294/64.1 |
| 5,645,391 | 7/1997 | Ohsawa et al. | 901/46 |
| 5,669,752 | 9/1997 | Moon | 414/941 |
| 5,841,515 | 11/1998 | Ohtani | 414/937 |
| 5,842,491 | 12/1998 | Han et al. | 134/44 |
| 5,863,170 | 1/1999 | Boitnott et al. | 414/937 |
| 5,867,359 | 2/1999 | Sherman | 361/234 |
| 5,872,694 | 2/1999 | Hoinkis et al. | 361/234 |
| 5,885,355 | 3/1999 | Song et al. | 414/937 |
| 5,903,123 | 5/1999 | Shimogama | 901/49 |
| 5,948,986 | 9/1999 | Brown | 361/234 |

*Primary Examiner*—Dean J. Kramer
*Assistant Examiner*—Paul T. Chin
*Attorney, Agent, or Firm*—Tung & Associates

[57] ABSTRACT

A self-sensing wafer holder in a robot blade is described which includes a holder body of generally elongated shape adapted for carrying a wafer on a top surface and at least three sensors positioned on the holder body sufficiently away from each other to form a plane that is covered by the wafer. The at least three sensors can be of the capacitive type, the optical type or the weight sensing type. The wafer holder is capable of determining whether a wafer is properly seated on top of the holder and automatically stopping the motion of the robot blade when a misplacement is detected by utilizing a sensing circuit including logic gates.

15 Claims, 2 Drawing Sheets

SELF-SENSING WAFER HOLDER AND METHOD OF USING

FIELD OF THE INVENTION

The present invention generally relates to a wafer holder for transporting wafers into and out of a semiconductor processing equipment and more particularly, relates to a self-sensing wafer holder for transporting wafers into and out of a loadlock chamber operated by a robotic arm that is capable of detecting whether a wafer is properly seated on the holder.

BACKGROUND OF THE INVENTION

In the fabrication processes for semiconductor devices, a semi-conducting wafer is normally processed through many different fabrication steps, i.e., sometimes as many as several hundred. These processing steps may include deposition processes, etching processes, ion implantation processes and a variety of other processes. The fabrication equipment utilized in these processes may include process chambers that are arranged in a cluster formation with a central loadlock chamber for delivering and withdrawing wafers to and from each process chamber.

One of the key components in a loadlock chamber is a wafer blade which is normally controlled by a robotic arm. The wafer blade is also called a robot blade by some equipment manufacturers. The robot blade can be constructed of a thin piece of metal such that it holds a wafer securely for delivering it into process chambers through narrow slit valves provided in the sides of the process chambers that join the loadlock chamber.

In a typical loadlock chamber, a robot blade and a storage elevator are provided. The loadlock chamber provides a wafer handling center in a clustered processing machine by isolating the plurality of process chambers from the surrounding atmosphere through the use of slit valves between the loadlock chamber and the process chambers. A cassette indexer or a SMIF pod may provide the source of wafers for the robot blade in the loadlock chamber. The loadlock chamber is normally provided with a self-contained vacuum system that maintains the interior of the chamber particle free and at a slightly higher pressure than the process chambers during wafer transfers to and from the process chambers. The self-contained vacuum system further provides the loadlock chamber with atmospheric pressure during wafer transfers to and from a cassette indexer. In a normal arrangement, up to about four process chambers can be mounted on a loadlock chamber.

A typical wafer holder, or robot blade 10 is shown in FIG. 1. The robot blade 10 is constructed mainly of a robot arm 12, and a wafer holder 14. The wafer holder 14 has a small thickness X such that it may go through narrow slit valves for delivering or withdrawing wafers to and from a process chamber or a cassette indexer. This is shown in FIG. 2. The robot arm 12 is constructed of a robot 18 and mechanical arms 20. The wafer holder 14 is constructed of a blade portion 22, a pair of sensors 24, 26, a pair of vacuum openings 28, 30, and a printed circuit board 32 for controlling the sensors 24, 26.

FIG. 2 and FIG. 3 show a cross-sectional view of the wafer holder 14 each holding a wafer 40 in a different position. In the configuration shown in FIG. 2, a wafer 40 is carried at the tip portion 36 of the blade 22 on top of the vacuum ports 28, 30. A vacuum is suppled to vacuum ports 28, 30 through a vacuum duct 34. The sensors 24, 26 are utilized to sense the presence of a substrate, or wafer that is properly seated or positioned on the blade 22. It should be noted that, in a conventional robot blade, only two sensors are utilized for such purpose.

As shown in FIG. 2, when a wafer 40 is carried on the tip portion 36 and secured by the vacuum force exerted on the backside 42 of the wafer 40, sensors 24, 26 of a capacitive type only sense a partial presence of the wafer 40 due to the distance existed between the wafer and the sensor. For instance, when capacitive sensors are used, a voltage of approximately between about 5 V and about 6 V is detected by the printed circuit board controller 32. The wafer handling position shown in FIG. 2 is used for delivering a wafer to a cassette indexer outside the load chamber.

In other circumstances, a wafer may be carried in pocket 38 in the blade 22 formed between the tip portion 36 and the PCB controller 32. The positioning of wafer shown in FIG. 3 is used for transporting wafers into process chambers. When the wafer 40 is positioned in the pocket 38 as shown in FIG. 3, one end of the wafer covers a capacity sensor 24 such that a voltage reading of between about 7 V and about 9 V is detected by the capacitive sensor 24 and the PCB controller 32. The voltage readings are then monitored by a machine operator as an indication of whether the wafer is properly positioned on the wafer holder 14 or not. When there is no wafer present on the wafer holder 14, a lower range of voltage, i.e, between about 2 V and about 4 V is normally detected.

While the wafer holder 14 in the robot blade 10 supplies some information about the positioning of the wafer on the wafer holder, it does not give an accurate indication of whether the wafer is properly seated on the holder. For instance, neither the position shown in FIG. 2 nor the position shown in FIG. 3 provides an accurate reading of a capacitive sensor to indicate the exact location of the wafer due to the fact that there is always a gap or distance between the wafer and the sensor. Furthermore, in the presently available robot blade system shown in FIG. 1, there is no interlocking circuit that provides a signal to interrupt a power supply to the robot blade such as to stop its motion completely when improper positioning of the wafer is detected.

It is therefore an object of the present invention to provide a wafer holder for use on a robot blade that does not have the drawbacks or the shortcomings of conventional robot blade type wafer holders.

It is another object of the present invention to provide a wafer holder on a robot blade that is equipped with a self-sensing means for detecting improperly positioned wafers on the wafer holder.

It is a further object of the present invention to provide a self-sensing wafer holder for holding and transporting a wafer in and out of a process chamber.

It is another further object of the present invention to provide a self-sensing wafer holder constructed of a holder body of generally elongated shape and at least three sensors positioned on the body to form a plane that is covered by a wafer when the wafer is carried by the holder body.

It is still another object of the present invention to provide a self-sensing wafer holder that includes a sensing circuit for determining the presence or absence of a wafer positioned on top of at least three capacitive sensors.

It is yet another object of the present invention to provide a self-sensing wafer holder which includes a sensing circuit adapted for outputting a signal to stop the motion of the wafer holder when the misplacement of a wafer positioned on top of the at least three sensors is detected.

It is still another further object of the present invention to provide a method for transporting a wafer on a self-sensing wafer holder by stopping the motion of the wafer holder when a sensing circuit receives signal from one of the at least three sensors and determines a status of misplacement of a wafer on top of the holder.

It is yet another further object of the present invention to provide a method for transporting a wafer on a self-sensing wafer holder by determining the presence or absence of a wafer positioned on top of at least three sensors by a sensing circuit.

SUMMARY OF THE INVENTION

In accordance with the present invention, a self-sensing wafer holder consists of a holder body and at least three sensors positioned on the holder body for detecting the misplacement of a wafer on top of the holder is provided. The present invention is further directed to a method for using a self-sensing wafer holder for transporting wafers into and out of a process machine equipped with a plurality of sensors positioned on the wafer holder body, and shutting off power to the wafer holder to stop its motion when misplacement of the wafer is detected.

In a preferred embodiment, a self-sensing wafer holder is provided which includes a holder body of generally elongated shape adapted for carrying a wafer on a top surface, the body has at least one dimension larger than a diameter of the wafer it is adapted for carrying, and at least three sensors positioned on the holder body sufficiently away from each other for forming a plane that is covered by the wafer when the wafer is carried by the holder body, the sensors are capable of sensing whether there is an object placed on top.

The self-sensing wafer holder further includes a sensing circuit for determining the presence or absence of a wafer positioned on top of the at least three sensors. The wafer holder may further include three sensors while the sensing circuit may further include three comparators each connected to one of the sensors, two AND logic gates and one OR logic gate. The sensing circuit is adapted for outputting a signal to stop the motion of the wafer holder when a misplacement of the wafer positioned on top of the at least three sensors is detected. The sensors can be capacitive sensors, optical sensors or weight sensors. The at least one dimension that is larger than a diameter of the wafer is a longitudinal dimension of a holder body of rectangular shape. The at least three sensors are positioned on the holder body in such a way that the sensors are at least partially covered by the wafer when the wafer is carried by the holder body.

In another preferred embodiment, a self-sensing wafer holder adapted for transporting wafers is provided which includes a holder body of generally elongated shape adapted for carrying a wafer on a top surface, the body has at least one dimension larger than a diameter of the wafer that is designed for carrying, and at least three sensors positioned on the holder body sufficiently away from each other with at least two of the sensors at least partially covered by one edge of the wafer and at least one of the sensors partially covered by an opposite edge of the wafer when the wafer is carried on the holder body, the sensors are adapted for determining whether there is an object placed on top and then outputting a first signal from each of the at least three sensors.

The self-sensing wafer holder may further include a sensing circuit for receiving a first signal from each of the at least three sensors and for determining whether there is a wafer placed on top of the holder body. The wafer holder may further include means for outputting a signal for stopping the motion of the wafer holder when the absence of a wafer positioned on top of the at least three sensors is detected. The wafer holder may further include three sensors while the sensing circuit may further include three comparators each in electrical communication with one of the sensors, two AND logic gates and one OR logic gate. The sensing circuit is capable of determining the presence or the absence of a wafer positioned on top of the at least three sensors.

The present invention is further directed to a method for transporting a wafer on a self-sensing wafer holder by the operating steps of first providing a holder body of generally elongated shape adapted for receiving a wafer on a top surface, the body has at least one dimension larger than a diameter of the wafer it is adapted for carrying, the holder body further includes at least three sensors positioned on the holder body sufficiently away from each other with at least two of the sensors at least partially covered by one edge of the wafer and at least one of the sensors partially covered by an opposite edge of the wafer when the wafer is positioned on the holder body, positioning a wafer on a top surface of the holder body for transporting, and stopping a motion of the wafer holder when a sensing circuit receives a first signal from each of the at least three sensors and determines the status of misplacement of a wafer on top of the holder body.

The method may further include the step of determining the presence or absence of a wafer positioned on top of the at least three sensors by the sensing circuit. The method may further include the step of providing a sensing circuit that includes three comparators each connected to one of the sensors, two AND logic gates and one OR logic gate. The method may further include the step of outputting a signal from the sensing circuit to stop the motion of the wafer holder when the absence of a wafer positioned on top of the at least three sensors is detected.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
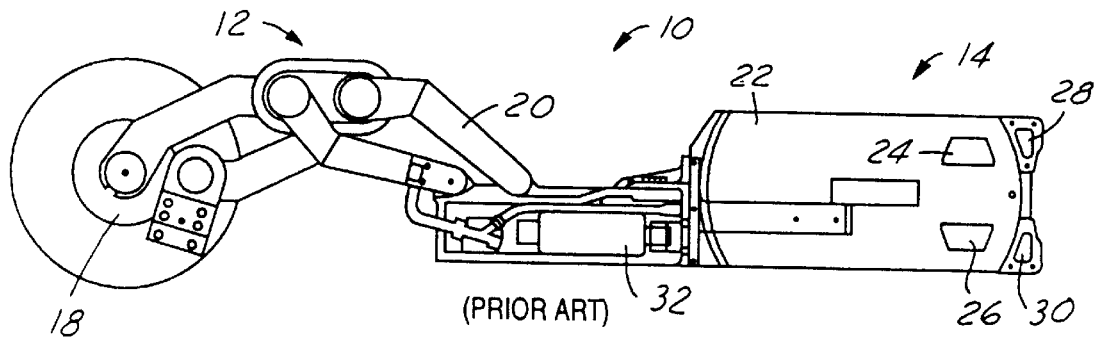
FIG. 1 is a plane view of a conventional robot blade having a wafer holder mounted thereon.
Figure 2:
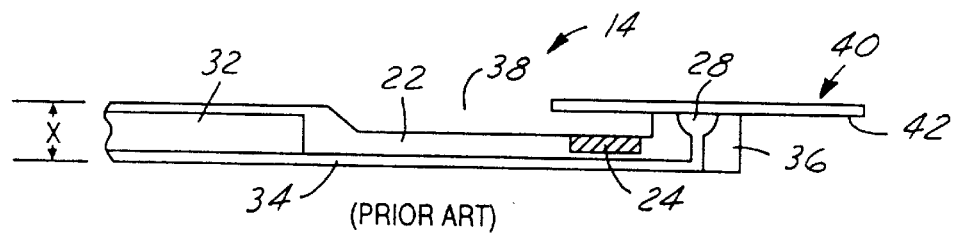
FIG. 2 is a partial, cross-sectional view of the wafer holder of FIG. 1 having a wafer held on its tip portion.
Figure 3:
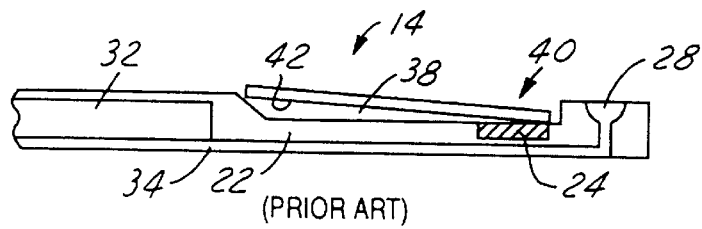
FIG. 3 is a partial, cross-sectional view of the wafer holder of FIG. 1 having a wafer held in a pocket.

The present invention discloses a self-sensing wafer holder in a robot blade assembly for transporting a wafer into and out of a process machine or a cassette indexer. The holder is constructed of a holder body that is generally of elongated shape for carrying a wafer on a top surface. The body should have at least one dimension larger than a diameter of the wafer it is designed for carrying. The wafer holder further includes at least three sensors that are positioned on the holder body sufficiently away from each other to form a plane that is covered by the wafer when a wafer is carried by the holder body. The at least three sensors can be of the capacitive sensor type, the optical sensor type or the weight sensor type.

The wafer holder further includes a sensing circuit which is used to determine the presence, the absence or misplacement of a wafer on top of the holder body by the at least three sensors. The sensing circuit utilizes at least three comparators each connected to one of the at least three sensors, two AND logic gates and one OR logic gate. The motion of the wafer holder can be stopped immediately when the misplacement of a wafer positioned on top of the holder body is detected by the at least three sensors and the sensing circuit to avoid accidental dropping and breakage of the wafer.

As the semiconductor industry increases the size of wafers from six inch, eight inch and up to twelve inch, the cost of wafers goes up proportionally. A reliable wafer transport system therefore becomes more important in order to minimize wafer scrap due to improper handling or transport of the wafers. As a result, an intelligent wafer sensing tool that can be included in a self-sensing wafer holder is required for future semiconductor processing industry. The present invention self-sensing wafer holder is capable of detecting, in an automated manner, any shift of position of a wafer on top of a wafer holder during wafer load/unload to or from a process chamber/cassette indexer. Once a position shift is detected by the intelligent wafer sensing tool, the motion of the wafer holder is stopped immediately to prevent accidental drop of the wafer from the holder and any possible damage or breakage of the wafer. In some circumstances, when the wafer is dropped from a wafer holder, for instance, at the door to a process machine or a cassette indexer, even though the wafer is not broken upon dropping, the subsequent closing of the process machine door will break the wafer.

The present invention novel wafer holder utilizes at least three sensors installed on a robot blade to detect whether a wafer is properly seated on the robot blade, or the wafer holder.

Any shift in position of the wafer during the robot loading/unloading process can be detected and the motion of the robot blade can be stopped immediately to prevent damage occurring to the wafer. Major benefits achieved by the present invention novel wafer holder is that it effectively prevents wafer dropping or breakage problem during robot transferring process, it prevents damages to the robot or the chamber in a wafer breakage event, it prevents cross contamination on other wafers during a wafer breakage situation, and it reduces the recovery time from a wafer breakage event.

The present invention intelligent wafer holder or robot transferring system was designed originally for an Applied Materials, Inc. Centura® clustered machine. However, it can be utilized on any other single-wafer or dual-wafer transfer systems. The present invention wafer holder is constructed of two major parts, an intelligent robot blade and an intelligent wafer sensor board. The intelligent robot blade includes the main components of three capacitive sensors that are installed on a wafer holder at a sufficient distance from each other. Since three points form a plane, it is recommended that at least three sensors is required to determine whether a wafer is properly seated on a wafer holder.

Figure 4:
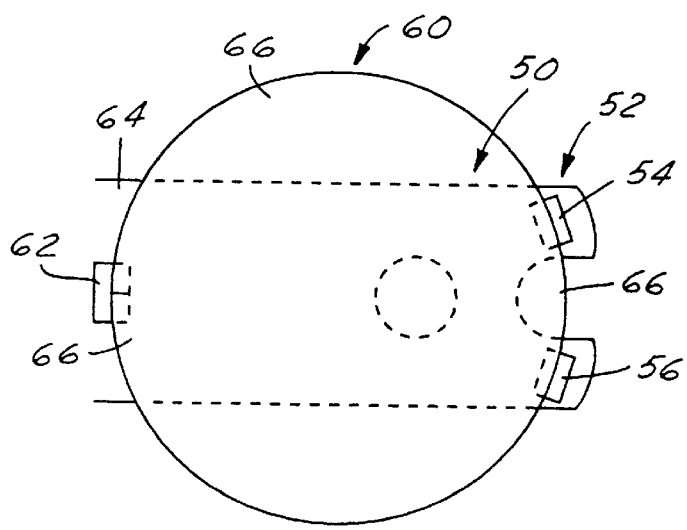
FIG. 4 is a plane view of a present invention wafer holder equipped with three capacitive sensors and a wafer placed on top.

Referring now to FIG. 4, wherein a present invention wafer holder 50 and a wafer 60 that is carried by the wafer holder are shown. The wafer holder 50 is constructed in an elongated shape, or generally a rectangular shape that has a small thickness. At the tip portion 52 of the holder, at least two sensors 54 and 56 are mounted thereto. A third sensor 62 is mounted at the base portion 64 of the wafer holder 50. The type of sensors utilized in the present invention may be capacitive type, optical type or weight sensing type.

As shown in FIG. 4, when a wafer 60 is properly seated on the wafer holder 50, the edge portion 66 of the wafer 60 partially covers the sensors 54, 56 and 62. When a capacitive type sensor is used, the partially covered sensors produce specific voltages which are monitored by the PCB controller (not shown). The value of the voltages generated by the capacitive sensors can be pre-set in a narrow range as an allowable range for defining a properly seated wafer, for instance, in the range between about 6 V and about 10 V, and preferably between about 7 V and 9 V. The voltage values can be easily determined by experimental methods. Once a preferred voltage range is determined, which allows for a small deviation from a perfectly positioned wafer such that even with the deviation, there is no danger for the wafer to fall off the wafer holder 50. The narrow, allowable voltage range is then inputted to the controller for the wafer holder.

Figure 5A:
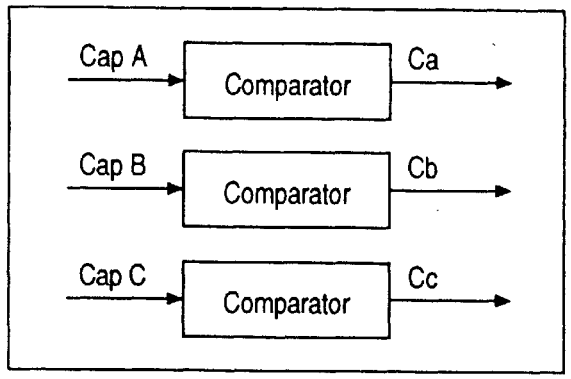
FIG. 5A is a block diagram illustrating the control circuit formed of comparators.
Figure 5B:
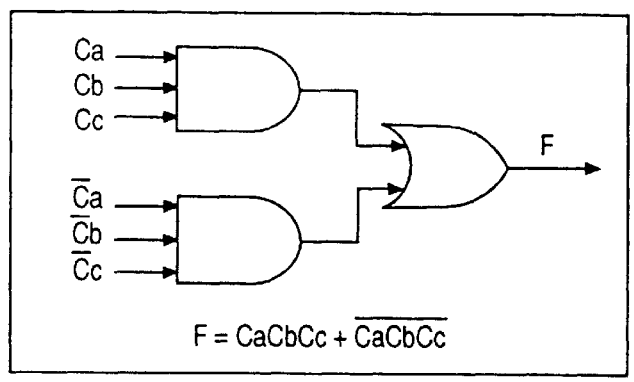
FIG. 5B is a diagram of the logic circuit for the present invention controller.
Figure 5C:
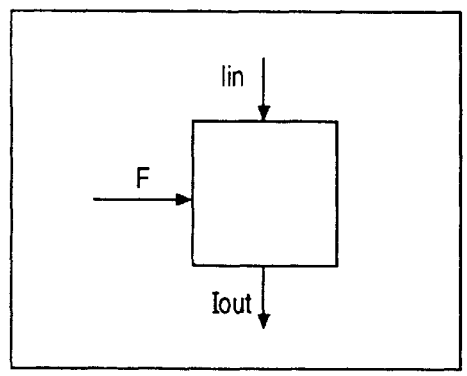
FIG. 5C is a diagram of the present invention interlock circuit.

The control functions for the wafer holder can be explained in FIGS. 5A~5C. The present invention intelligent wafer sensor board or controller executes three major functions of judgment, decision and interlock. At the judgment stage, three comparators are utilized when three sensors are positioned on the wafer holder 50. This is shown in FIG. 5A. One of the comparators is connected to one of the capacitive sensors output. For instance, Cap A can be the output from the capacitive sensor 54, Cap B can be the output from the capacitive sensor 56, while Cap C can be the output from the capacitive sensor 62. If no wafer is sensed on the specific capacitive sensor, the sensor outputs a "false" output. When a wafer is sensed by the capacitive sensor indicating a properly seated wafer, the sensor outputs a "true" output. The outputs from the three capacitive sensors 54, 56 and 62 are shown in FIG. 5A as Ca, Cb and Cc. In the next step of the process, as shown in FIG. 5B, two AND logic gates and one OR logic gate is utilized. If all three inputs are "true" or "false", the output will be "true". Otherwise, the output will be "false". In the last stage of the process, as shown in FIG. 5C, the interlock operation works in the manner such that a "true" input will enable the wafer transfer system, while a "false" input will disable the wafer transfer system. As shown in FIG. 5C, I indicates an input or output signal.

The present invention novel apparatus of a self-sensing wafer holder for a robot blade and the method for using such wafer holder have therefore been amply described and demonstrated in the above descriptions and the appended drawings of FIGS. 4~5C. It should be noted that, while the transporting of wafers is illustrated in the preferred embodiment, the present invention transport system can be used to transport any substrate and is not limited to a semiconductor wafer.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A self-sensing wafer holder comprising:
   a holder body of generally elongated shape adapted for carrying a wafer on a top surface, said body having at least one dimension larger than a diameter of said wafer adapted for carrying,
   at least three sensors positioned on said holder body sufficiently away from each other for forming a plane that is covered and contacted by said wafer when said wafer is carried by said holder body, said sensors being capable of sensing whether there is an object placed on top, and
   a sensing circuit for determining the presence or absence of a wafer positioned on top of said at least three sensors,
   said sensing circuit further comprises three comparators and each connected to one of said sensors, two AND logic gates and one OR logic gate.

2. A self-sensing wafer holder according to claim 1, wherein said sensing circuit is adapted for outputting a signal to stop the motion of the wafer holder when the misplacement of a wafer positioned on top of said at least three sensors is detected.

3. A self-sensing wafer holder according to claim 1, wherein said at least three sensors are selected from the group consisting of capacitive sensors, optical sensors and weight sensors.

4. A self-sensing wafer holder according to claim 1, wherein said at least three sensors are capacitive sensors.

5. A self-sensing wafer holder according to claim 1, wherein said at least one dimension larger than a diameter of said wafer is a longitudinal dimension of a holder body of rectangular shape.

6. A self-sensing wafer holder according to claim 1, wherein said at least three sensors are positioned on said holder body in such a way that the sensors are at least partially covered by said wafer when said wafer is carried on said holder body.

7. A self-sensing wafer holder adapted for transporting wafers comprising:
   a holder body of generally elongated shape adapted for carrying a wafer on a top surface, said body having at least one dimension larger than a diameter of the wafer that it is designed for carrying,
   at least three sensors positioned on said holder body sufficiently away from each other with at least two of said sensors at least partially covered and contacted by one edge of said wafer and at least one of said sensors at least partially covered and contacted by an opposite edge of said wafer when said wafer is carried on said holder body, said sensors are adapted for determining whether there is an object placed on top and then outputting a first signal from each of said at least three sensors, and
   a sensing circuit for receiving said first signal from each of said at least three sensors and for determining whether there is a wafer placed on top of said holder body,
   said sensing circuit further comprises three comparators each in electrical communication with one of said sensors, two AND logic gates and one OR logic gate.

8. A self-sensing wafer holder adapted for transporting wafers according to claim 7, wherein said sensing circuit further comprising means for outputting a signal for stopping the motion of said wafer holder when the absence of a wafer positioned on top of said at least three sensors is detected.

9. A self-sensing wafer holder adapted for transporting wafers according to claim 7 further comprising a sensing circuit for determining the presence or the absence of a wafer positioned on top of said at least three sensors.

10. A self-sensing wafer holder adapted for transporting wafers according to claim 8, wherein said at least three sensors are selected from the group consisting of capacitive sensors, optical sensors and weight sensors.

11. A self-sensing wafer holder adapted for transporting wafers according to claim 7, wherein said at least three sensors are capacitive sensors.

12. A method for transporting a wafer on a self-sensing wafer holder comprising the steps of:
   providing a holder body of generally elongated shape adapted for receiving a wafer on a top surface, said body having at least one dimension larger than a diameter of said wafer it is adapted for carrying, said holder body further comprising at least three sensors positioned on said holder body sufficiently away from each other with at least two of said sensors at least partially covered and contacted by one edge of said wafer and at least one of said sensors at least partially covered and contacted by an opposite edge of said wafer when said wafer is carried by said holder body, said sensors are adapted for determining whether there is an object placed on top and then outputting a first signal from each of said at least three sensors,
   positioning a wafer on a top surface of said holder body for transporting, and
   stopping a motion of said wafer holder when a sensing circuit receives a first signal from at least one of said at least three sensors and determines a status of misplacement of a wafer on top of said holder body, said sensing circuit comprises three comparators each connected to one of three sensors, two AND logic gates and one OR logic gate.

13. A method for transporting a wafer on a self-sensing wafer holder according to claim 12 further comprising the step of determining the presence or absence of a wafer positioned on top of said at least three sensors by said sensing circuit.

14. A method for transporting a wafer on a self-sensing wafer holder according to claim 12 further comprising the step of outputting a signal from said sensing circuit to stop the motion of said wafer holder when the absence of a wafer positioned on top of said at least three sensors is detected.

15. A method for transporting a wafer on a self-sensing wafer holder according to claim 12, wherein said at least three sensors are selected from the group consisting of capacitive sensors, optical sensors and weight sensors.

* * * * *